US006561836B1

(12) United States Patent
Marshall et al.

(10) Patent No.: US 6,561,836 B1
(45) Date of Patent: May 13, 2003

(54) SYSTEM AND METHOD FOR COUPLING A COMMUNICATION SIGNAL TO A COMMUNICATION DEVICE

(75) Inventors: Robert A. Marshall, Georgetown; Earl W. Boone, Round Rock, both of TX (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 09/729,451

(22) Filed: Dec. 4, 2000

(51) Int. Cl.[7] .............................................. H01R 13/64
(52) U.S. Cl. ...................................... 439/378; 439/608
(58) Field of Search ................................... 439/378, 608

(56) References Cited

U.S. PATENT DOCUMENTS

| | | | | |
|---|---|---|---|---|
| 3,597,716 A | * | 8/1971 | Stuart et al. | 339/102 R |
| 4,954,086 A | * | 9/1990 | Hill et al. | 439/65 |
| 4,963,098 A | * | 10/1990 | Myer et al. | 439/76 |
| 5,222,907 A | * | 6/1993 | Katabuchi et al. | 439/377 |
| 5,443,398 A | * | 8/1995 | Ortega | 439/378 |
| 5,634,810 A | * | 6/1997 | Niitsu et al. | 439/378 |
| 5,889,850 A | * | 3/1999 | Sochacki | 379/329 |

OTHER PUBLICATIONS http://catalog.tycoelectronics.com/AMP/docs/pdf/0/09/165900,pdf.
Wire to Board Connector Assemblies for PC Board (2.54x5.08mm Foot Print), AMP, p. 484 (Approximately Nov. 2000).

* cited by examiner

Primary Examiner—Renee Luebke
Assistant Examiner—Ann McCamey
(74) Attorney, Agent, or Firm—Baker Botts L.L.P.

(57) ABSTRACT

According to one embodiment of the invention, a system for coupling a communication signal to a communication device includes a backplane, having first and second sides, and a connector, adapted to receive the communication signal, coupled to the backplane on the first side. The connector has a first set of conductive pins that extend through the first side of the backplane and protrude out the second side of the backplane. A portion of the first set of conductive pins is adapted to receive a line card connector formed with a plurality of contact cavities. The system further includes a guide member operable to guide a line card into the line card connector.

39 Claims, 3 Drawing Sheets

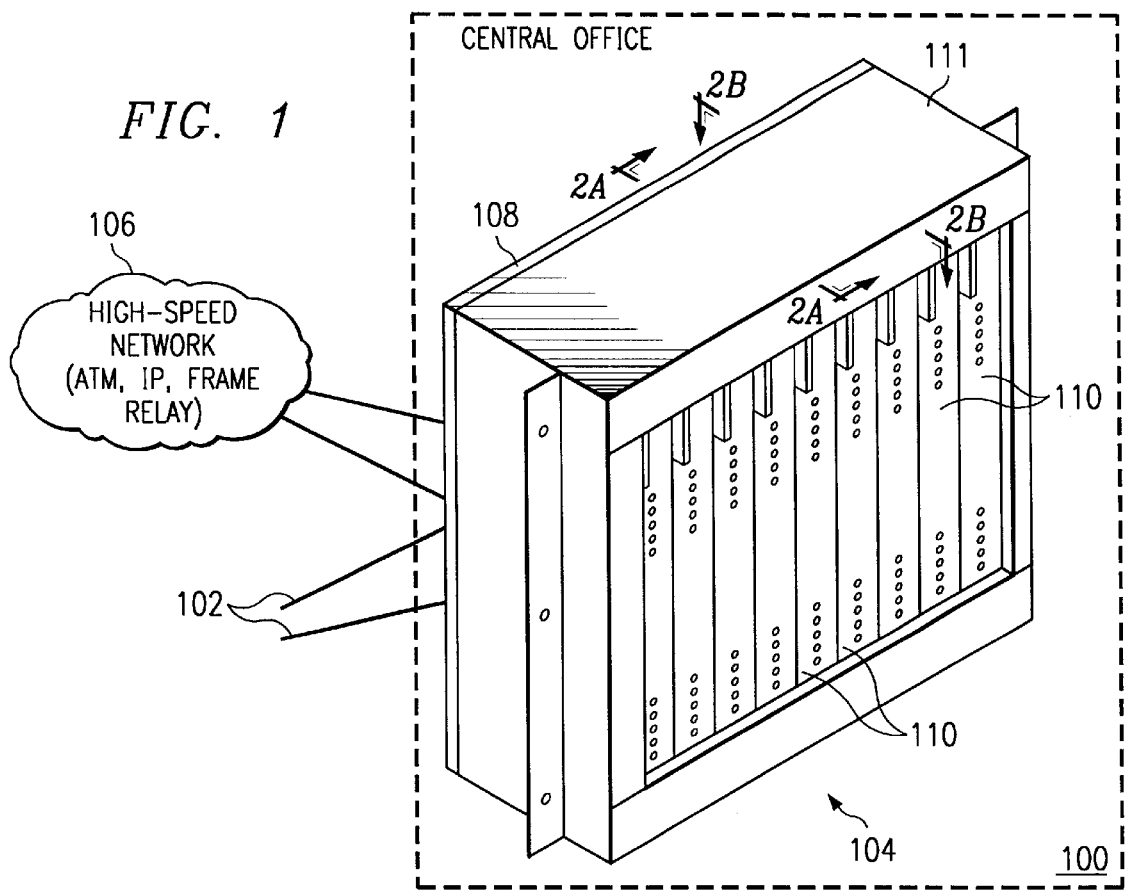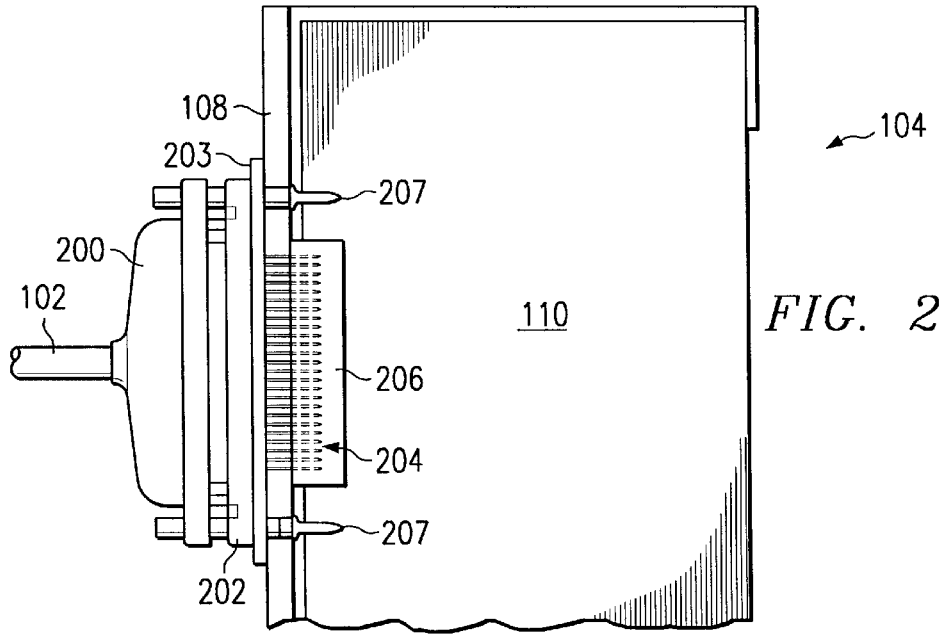

SYSTEM AND METHOD FOR COUPLING A COMMUNICATION SIGNAL TO A COMMUNICATION DEVICE

TECHNICAL FIELD OF THE INVENTION

This invention relates generally to the field of communications and, more specifically, to a system and method for coupling a communication signal to a communication device.

BACKGROUND OF THE INVENTION

In the world of high-speed communications and networks, there are many types of communications devices, such as digital subscriber line access multiplexers ("DSLAMs"), voice switches, and other devices that aggregate subscriber lines into a central office. These communication devices receive signals from subscribers and route them to networks such as ATM networks, IP networks, frame relay networks, or TDM networks. A typical DSLAM has a backplane with connectors on one side to receive signals from a subscriber, and connectors on the other side that accept any number of line cards, which may support any of various xDSL technologies. These line cards are usually housed in a chassis, along with other devices for such things as power modules and switching modules. Because of many various electronic components, circuitry, and other hardware, space is at a premium in central office environments. In addition, because of the many electronic devices and circuitry, considerable electronic interference exists in central office environments, which may cause crosstalk. Therefore, communication device manufacturers strive to manufacture communication devices that maximize space efficiency and minimize crosstalk.

There are different ways to route subscriber signals to line cards. One utilizes a Cisco DSLAM with a 61xx backplane. The Cisco 61xx backplane has Champ connectors connected to one side of the backplane and printed circuit board routing inside the backplane for routing the signals to the appropriate line cards on the other side of the backplane. The routing inside the backplane usually consists of many traces within the backplane, which causes the backplane to have greater thickness and greater surface area. The routing also results in impedance discontinuities and crosstalk. There are also large voids in the backplane ground planes to accommodate TNV to SELV safety requirements for the Champ connectors and the line card connectors. These voids allow increased ElectroMagnetic Interference ("EMI").

Another way of routing subscriber signals to line cards is utilized in a Lucent® Stinger™. The Lucent® Stinger™ is a digital subscriber line access concentrator that utilizes a midplane design, which eliminates routing requirements in the midplane for the incoming telco signals. However, the Stinger™ does have routing on line protection modules on one side of the midplane. The line protection module has Champ connectors that receive the subscriber signals, and routing that routes the signals to connectors that connect to the midplane connector on one side of the midplane. The pins of this connector pass through the midplane and become the receiving connector for the line cards. Line cards on the other side of the midplane receive the signals via these connectors. Therefore, the signals are not directly sent to the line card without routing. Also, the midplane design requires physical access to both sides of the chassis for installation and maintenance.

An additional method of coupling subscriber signals to line cards utilizes no backplane and no line protection modules with routing. This method uses insulation displacement connectors with flexible wires connected thereto. These flexible wires are then connected to insulation displacement connectors that connect to a line card. Even though there is a direct connection to the line card with no routing requirements, the flexible wires still waste space, and cause electronic interference. In addition, the termination of the wires at the insulation displacement connectors increase manufacturing difficulty and labor cost, and decreases reliability.

SUMMARY OF THE INVENTION

The challenges in the field of communications continue to increase with demands for more and better techniques having greater flexibility and adaptability. Therefore, a need has arisen for a new system and method for coupling a communication signal to a communication device.

In accordance with the present invention, a system and method for coupling a communication signal to a communication device is provided that addresses disadvantages and problems associated with previously developed systems and methods.

According to one embodiment of the invention, a system for coupling a communication signal to a communication device includes a backplane, having first and second sides, and a connector, adapted to receive the communication signal, coupled to the backplane on the first side. The connector has a first set of conductive pins that extend through the first side of the backplane and protrude out the second side of the backplane. A portion of the first set of conductive pins is adapted to receive a line card connector formed with a plurality of contact cavities. The system further includes a guide member operable to guide a line card into the line card connector.

According to another embodiment of the invention, a method for coupling a communication signal to a communication device includes coupling a connector having a first set of conductive pins to a backplane having first and second sides. The connector is adapted to receive the communication signal. The method further includes protruding the first set of conductive pins out the second side of the backplane, wherein a portion of the first set of conductive pins is adapted to receive a line card connector formed with a plurality of contact cavities. The method also includes positioning a housing adjacent the first set of conductive pins.

Embodiments of the invention provide numerous technical advantages. For example, a technical advantage of one embodiment of the present invention is that wasted backplane real estate is substantially reduced. This real estate savings is accomplished by placing the Champ connector near the line card centerline. There are no routing requirements for the communication signals from the Champ connectors to the line cards. Thus, the backplane is reduced in area and thickness, thereby saving valuable space. In addition, impedance discontinuities and crosstalk are minimized because of less metallization in the backplane. Another technical advantage of one embodiment of the present invention is that a printed circuit board berrol is not required if the connector pins are designed to press directly into fiberglass or the pins on the Champ connector could pass through the backplane and be held in place by the shroud. Another technical advantage of one embodiment of the present invention is that overmolding connector pins as they pass through a backplane reduces the safety requirements between the telco pins and chassis ground from a creepage distance to a distance through insulation. This overmolding allows a ground fill to extend between the pins, thereby reducing the EMI aperture from a large void to many small holes.

Other technical advantages are readily apparent to one skilled in the art from the following figures, descriptions, and claims.

BRIEF DESCRIPTION OF THE DRAWINGS

For a more complete understanding of the invention, and for further features and advantages, reference is now made to the following description, taken in conjunction with the accompanying drawings, in which:

FIG. 1 is a schematic diagram illustrating one embodiment of a central office showing a communication device used in coupling a communication signal to a high-speed network in accordance with the present invention;

FIG. 2A is a partial elevation view of the communication device in FIG. 1 showing a communication signal coupled thereto in accordance with one embodiment of the present invention;

DETAILED DESCRIPTION OF EMBODIMENTS OF THE INVENTION

Figure 2B:
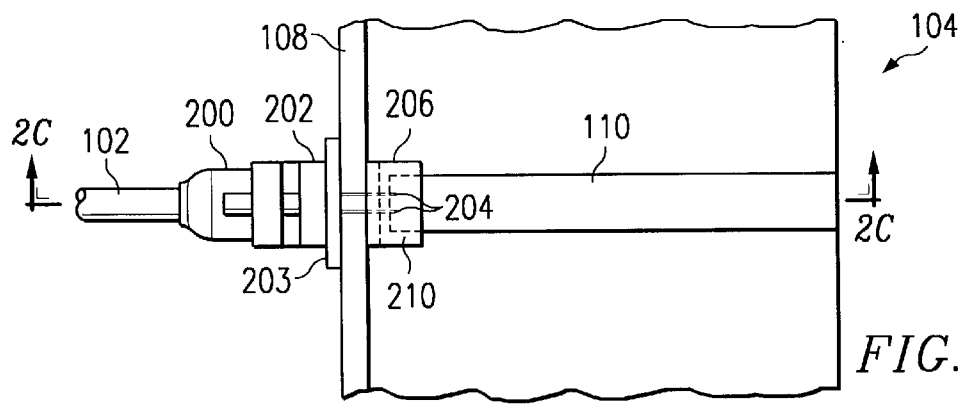
FIG. 2B is a partial plan view of the communication device in FIG. 2A.
Figure 2C:
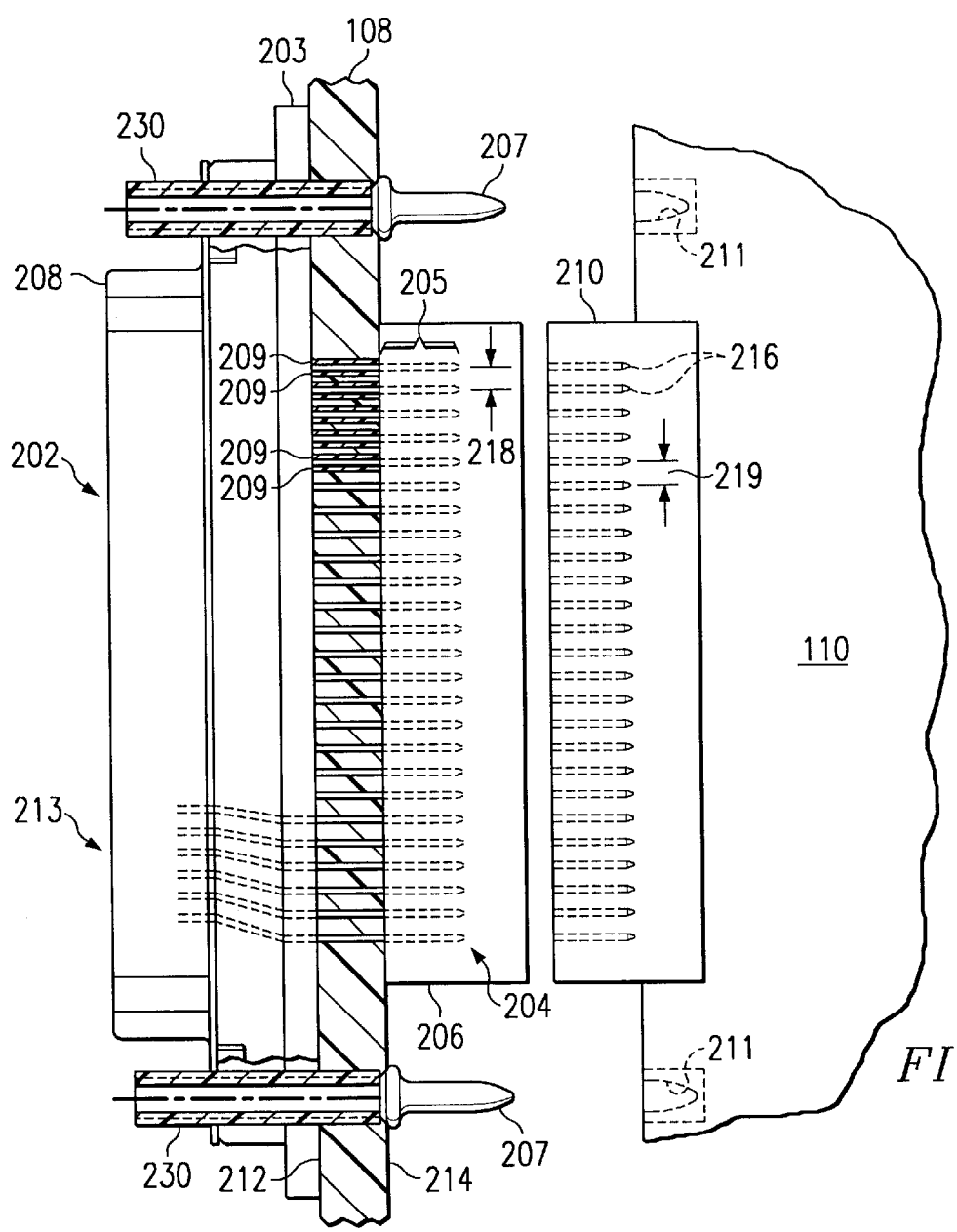
FIG. 2C is an elevation view of one embodiment of a connector for coupling a communication signal to a communication device in accordance with the present invention.
Figure 2D:
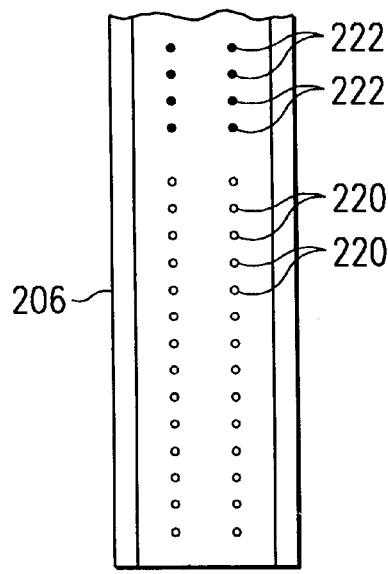
FIG. 2D is an elevation view of one embodiment of a housing used in coupling a communication signal to a communication device in accordance with the present invention.
Figure 3:
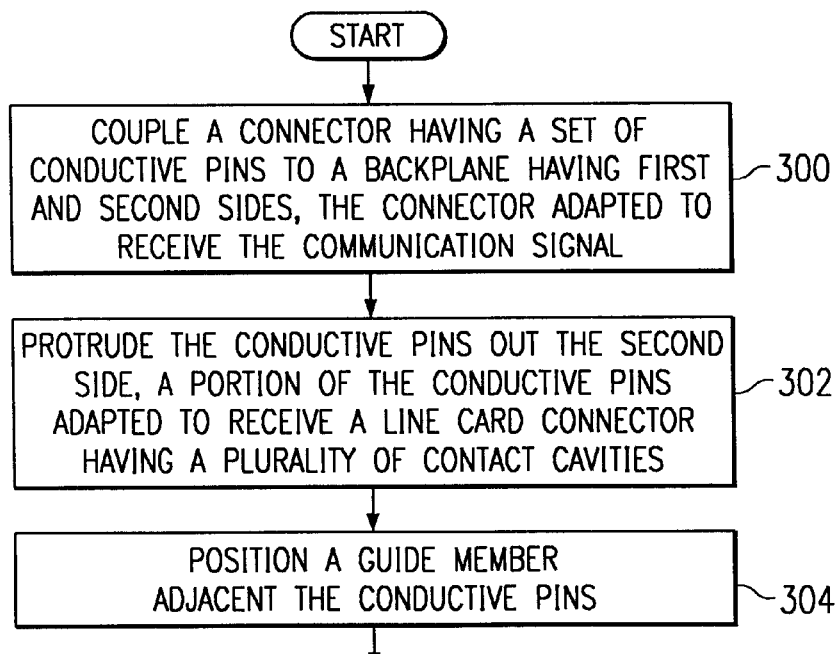
FIG. 3 is a flowchart demonstrating one method for coupling a communication signal to a communication device in accordance with the present invention.

Embodiments of the present invention and their advantages are best understood by referring now to FIGS. 1 through 3 of the drawings, in which like numerals refer to like parts.

FIG. 1 is a schematic diagram illustrating one embodiment of a central office 100 used in coupling communication signals from subscriber lines 102 to a high-speed network 106 via a communication device 104 in accordance with the present invention. Central office 100 may be any suitable central office or other telecommunications equipment space of a communications company. Subscriber lines 102 may be twisted pair subscriber lines that carry communication signals from homes and/or businesses. High-speed network 106 may be any type of high-speed backbone network such as an Asynchronous Transfer Mode ("ATM") network, an Internet Protocol ("IP") network, frame relay network, or Time Division Mutliplex ("TDM") network. Communication device 104 may be a digital subscriber line access multiplexer ("DSLAM") as shown, or may be other communication devices that aggregate subscriber lines 102 into network 106, such as a voice switch or a DAX. For clarity of description, communication device 104 is hereinafter described as if it were a DSLAM.

FIG. 1 shows communication device 104 having line cards 110 housed within a chassis 111. Line cards 110 may be network interface cards that support any mix of copper subscriber line technologies. For example, line cards 110 may be four port, eight port, twenty-four port, or forty-eight port DSL interface cards. Line cards 110 have connectors (not shown) for coupling line cards 110 to a backplane 108. Backplane 108 is the interface between line cards 110 and communication signals from subscriber lines 102. In most communication devices having backplanes routing exists inside the backplane for routing communication signals to appropriate line cards. Routing inside a backplane usually consists of many conductive traces within the backplane, which causes the backplane to have greater thickness and greater surface area. Routing also results in impedance discontinuities and crosstalk. The present invention addresses these problems, and others, by providing a connector 202 (FIGS. 2A–2C) for coupling communication signals from subscriber lines 102 to line cards 110. Connector 202 eliminates the need for routing copper subscriber lines in backplane 108 thereby reducing wasted backplane real estate and saving valuable space in central office 100. In addition, impedance discontinuities and crosstalk are minimized because of less metallization in backplane 108. Communication signals are directly connected to line cards 110 by one or more connectors 202, an example of which is illustrated in FIGS. 2A through 2C.

FIGS. 2A and 2B are partial elevation and plan views, respectively, of communication device 104 showing a communication signal coupled to a line card 110 via subscriber line 102, a subscriber connector 200, and connector 202 having a set of conductive pins 204. FIGS. 2A and 2B also show a ferrite plate 203 disposed between connector 202 and backplane 108, a housing 206 adjacent conductive pins 204, and a set of guide pins 207 adjacent conductive pins 204.

Subscriber connector 200 may be any suitable connector, such as a Champ connector or other standard connectors well known in the art of communications. Connector 202, which is described in greater detail below in conjunction with FIG. 2C, is adapted to receive communication signals through subscriber connector 200 and transmit communication signals through backplane 108 to line cards 110 via conductive pins 204. Line cards 110 typically have a line card connector 210 (shown best in FIG. 2C) coupled thereto operable to receive communication signals from conductive pins 204. Line card connector 210 is coupled to conductive pins 204, which may be part of a separate connector or, in the embodiment shown in FIGS. 2A through 2C, may form a portion of connector 202.

Ferrite plate 203 is formed from ferrite and may be utilized to minimize ElectroMagnetic Interference ("EMI") from inside chassis 111. Ferrite plate 203 is formed with any suitable shape and size for covering up any voids in backplane 108 caused by connector 202. In one embodiment, ferrite plate 203 is disposed between connector 202 and backplane 108, however ferrite plate 201 may be placed on either side of backplane 108. Ferrite plate 203 may also have apertures formed therein so ferrite plate 203 can fit properly on conductive pins 204. In an alternative embodiment, ferrite plate 203 is plastic-coated to prevent arcing from conductive pins 204.

Housing 206 may be coupled to second side 214 of backplane 108 to protect conductive pins 204 and to act as a guide member for guiding line card connector 210 onto conductive pins 204 to produce an accurate fit of line card 110. In one embodiment, housing 206 is a Metral® shroud by FCI Electronics; however, other types of housings may be used and housing 206 may be formed from any suitable non-conductive material. Housing 206, discussed in greater detail below in conjunction with FIG. 2D, may also be formed with apertures 220 that frictionally engage conductive pins 204, thereby keeping housing 206 in place. This frictional engagement is in lieu of, or in addition to, coupling housing 206 to backplane 108.

Set of guide pins 207 may be coupled to second side 214 of backplane 108 to act as guide members for guiding line card connector 210 onto conductive pins 204 to produce an accurate fit of line card 110. In this embodiment, a set of guide pin cavities 211 exist on line card 110 for proper alignment. Set of guide pins 207 may be utilized in lieu of, or in addition to, housing 206. In one embodiment, set of guide pins 207 are small non-conductive pins coupled to second side 214 of backplane 108 in any suitable manner; however, other suitable types material may be used for set of guide pins 207.

FIG. 2C is an elevation view of one embodiment of connector 202 illustrating conductive pins 204 extending through ferrite plate 203, a first side 212 of backplane 108 and protruding through second side 214 of backplane 108. FIG. 2C also shows housing 206 and set of guide pins 207 adjacent conductive pins 204, line card connector 210 formed with contact cavities 216, and a molding 209 coupled to conductive pins 204.

Connector 202 has a body 208 adapted to receive a communication signal via subscriber connector 200 (FIG. 2A) and to transmit the communication signal to conductive pins 204, which are coupled to body 208. In one embodiment, body 208 resembles a Champ connector body; however, body 208 may be any suitable size and shape desired. Connector 202 is coupled to backplane 108 in any suitable manner. In one embodiment, connector 202 is coupled to backplane 108 using screws (not shown) through screw guides 230 as shown in FIG. 2C; however, connector 202 may be coupled to backplane 108 in other ways, such as press fitting connector 202 into backplane 108.

A portion 205 of conductive pins 204 acts as a connection for line card 110 via line card connector 210. In the embodiment shown in FIG. 2C, conductive pins 204 are formed from substantially rigid metal and are formed integral with connector 202. By providing one connector 202 for every twenty-four or twenty-five ports (not shown) on line card 110, conductive pins 204 provide a direct connection from connector 202 to line card 110 without having traces formed in backplane 108. This elimination of routing various communication signals to their respective line cards via traces results in saved backplane real estate and thinner backplanes, and a reduction in electronic interference and crosstalk.

As described above, line card connector 210 is formed with contact cavities 216 for accepting conductive pins 204. For line card connector 210 to fit properly onto conductive pins 204, a pitch 218 of conductive pins 204 must substantially equal a pitch 219 of contact cavities 216. Pitch 218 is defined as the distance between the centerlines of conductive pins 204, and pitch 219 is defined as the distance between the centerlines of contact cavities 216. Any suitable pitch may be used; however, in one embodiment, conductive pins 204 and contact cavities 216 are aligned in two rows, each row having a two millimeter pitch. This two millimeter pitch is a standard pitch for standard line card connectors. Therefore, if a standard Champ connector is used for connector 202, then conductive pins 204 are formed into a pitch of two millimeters (not shown). In another embodiment, conductive pins 204 and contact cavities 216 are aligned in two rows, each row having a 2.159 millimeter pitch. This 2.159 millimeter pitch is a standard for a standard ham connector. This means that line card 110 has to have a non-standard line card connector 210 with contact cavities 216 that have a 2.159 millimeter pitch. In yet another embodiment, conductive pins 204 and contact cavities 216 are aligned in two rows, each row formed into a pitch of 2.54 millimeter (illustrated in FIG. 2C by arrow 213). This 2.54 millimeter pitch is a standard pitch for a line card connector. Pitch 218 may be accomplished in any suitable manner, such as forming conductive pins 204 so that portion 205 of conductive pins 204 is generally perpendicular to backplane 108 so that they can accept contact cavities 216 of line card connector 210 properly. The teachings of the present invention realize that conductive pins 204 may be aligned in two staggered rows rather than two aligned rows.

Molding 209 is any suitable type of non-conductive molding and is shown in FIG. 2C to be coupled to conductive pins 204. Molding 209 on conductive pins 204 is optional. Having mug 209 on conductive pins 204 in an area where conductive pins 204 pass trough backplane 108 reduces the safety requirements between conductive pins 204 and chassis ground from a creepage distance to a distance through insulation. Molding 209 allows a ground fill to extend between conductive pins 204, thereby reducing an EMI aperture from a large void to many small holes.

FIG. 2D is an elevation view of housing 206 used in coupling a communication signal to communication device 104 in accordance with one embodiment of the present invention. In one embodiment, housing 206 is coupled to second side 214 of backplane 108 to protect conductive pins 204 and to guide line card connector 210 to produce an accurate fit of line card 110; however, housing 206 may have apertures 220 that frictionally engage conductive pins 204, thereby keeping housing 206 secure. As mentioned previously, this frictional engagement may be in lieu of, or in addition to, coupling housing 206 to backplane 108. Housing 206 may also have a plurality of conductive pins 222 that are used to connect other electronic devices, such as a protect bus.

FIG. 3 is a flowchart demonstrating one method of coupling a communication signal to communication device 104 in accordance with the present invention. Connector 202 having conductive pins 204 is coupled to backplane 108 at step 300. Backplane 108 has first side 214 and second side 216, and connector 202 is adapted to receive the communication signal. Conductive pins 204 protrude out second side 216 of backplane 108 at step 302. This protrusion results in portion 205 of conductive pins 204 being adapted to receive line card connector 210, which has contact cavities 216. A guide member, such as housing 206 and/or set of guide pins 207 is positioned adjacent conductive pins 204 on second side 216 at step 304. Housing 206 or set of guide pins 207 is adjacent conductive pins 204 to guide line card connector 210 into its correct position. Housing 206 also serves to protect conductive pins 204.

The method described above in conjunction with FIG. 3 allows communication signals coming from subscriber lines 102 to be directly passed through to line cards 110 without having to route the signals through the backplane to various line cards. This method also reduces the amount of wasted space on backplane 108 as well as reducing electronic interference and crosstalk.

Although embodiments of the invention and their advantages are described in detail, a person skilled in the art could make various alternations, additions, and omissions without departing from the spirit and scope of the present invention as defined by the appended claims.

What is claimed is:

1. A system for coupling a communication signal to a communication device, comprising:

a backplane having first and second sides;

a connector, adapted to receive the communication signal, coupled to the backplane on the first side, the connector having a first set of conductive pins that extend through the first side and protrude out the second side, a portion of the first set of conductive pins adapted to receive a line card connector being formed with a plurality of contact cavities; and a guide member coupled to the second side of the backplane, the guide member operable to guide the line card connector onto the portion of the first set of conductive pins.

2. The system of claim 1, wherein the guide member comprises a set of guide pins adjacent to the portion of the first set of conductive pins.

3. The system of claim 1, wherein one connector is provided for every twenty-four ports on a line card.

4. The system of claim 1, further comprising a ferrite plate disposed between the connector and the backplane.

5. The system of claim 1, wherein a pitch of the portion of the first set of conductive pins is adapted to equal a pitch of the contact cavities.

6. The system of claim 5, wherein the portion of the first set of conductive pins are aligned in two rows, each row having a two millimeter pitch.

7. The system of claim 5, wherein the portion of the first set of conductive pins are aligned in two rows, each row having a 2.54 millimeter pitch.

8. The system of claim 1, wherein the guide member comprises a housing adjacent to the portion of the first set of conductive pins.

9. The system of claim 8, wherein the housing is formed with a plurality of apertures, the apertures frictionally engaged with the portion of the first set of conductive pins.

10. The system of claim 8, wherein the housing further comprises a second set of conductive pins, the second set of conductive pins adapted to receive a protect bus.

11. A connector system used in coupling a communication signal to a communication device, comprising:

a body adapted to receive the communication signal and to transmit the body;

wherein the first set of conductive pins are adapted to extend through a first side of a backplane and protrude out a second side of the backplane such that a second portion of the first set of conductive pins is adapted to receive a line card connector being formed with a plurality of contact cavities; and a housing formed with a plurality of apertures, the apertures frictionally engaged with the second portion of the first set of conductive pins.

12. The system of claim 11, wherein one connector is provided for every twenty-four ports on a line card.

13. The system of claim 11, further comprising a ferrite plate coupled to the first portion of the first set of conductive pins.

14. The system of claim 11, further comprising a molding coupled to the first set of conductive pins.

15. The system of claim 11, wherein a pitch of the second portion of the first set of conductive pins is adapted to equal a pitch of the contact cavities.

16. The system of claim 15, wherein the second portion of the first set of conductive pins are aligned in two rows, each row having a two millimeter pitch.

17. The system of claim 15, wherein the second portion of the first set of conductive pins are aligned in two rows, each row having a 2.54 millimeter pitch.

18. The system of claim 11, wherein the housing further comprises a second set of conductive pins, the second set of conductive pins adapted to receive a protect bus.

19. A method for coupling a communication signal to a communication device, the method comprising:

coupling a connector having a first set of conductive pins to a backplane having first and second sides, the connector adapted to receive the communication signal;

protruding the first set of conductive pins out the second side of the backplane, a portion of the first set of conductive pins adapted to receive a line card connector being formed with a plurality of contact cavities; and positioning a guide member adjacent the portion of the first set of conductive pins, the guide member operable to guide the line card connector onto the portion of the first set of conductive pins.

20. The method of claim 19, wherein positioning a guide member adjacent the portion of the first set of conductive pins comprises coupling a set of guide pins adjacent the portion of the first set of conductive pins.

21. The method of claim 19, further comprising providing one connector for every twenty-four ports on a line card.

22. The method of claim 19, further comprising disposing a ferrite plate between the connector and the backplane.

23. The method of claim 19, further comprising coupling a molding to the first set of conductive pins.

24. The method of claim 19, further comprising providing the portion of the first set of conductive pins with a pitch that is adapted to a pitch of the contact cavities.

25. The method of claim 23, further comprising aligning the portion of the first set of conductive pins in two rows, each row having a two millimeter pitch.

26. The method of claim 23, further comprising aligning the portion of the first set of conductive pins in two rows, each row having a 2.54 millimeter pitch.

27. The method of claim 19, wherein positioning a guide member adjacent the portion of the first set of conductive pins comprises frictionally engaging a plurality of apertures formed in a housing with the portion of the first set of conductive pins.

28. The method of claim 27, further comprising providing the housing with a second set of conductive pins, the second set of conductive pins adapted to receive a protect bus.

29. A system for coupling a communication signal to a communication device comprising:

means for coupling a connector having a first set of conductive pins to a backplane having first and second sides, the connector adapted to receive the communication signal, and wherein the first set of conductive pins extend through the first side of the backplane and protrude out the second side of the backplane and are adapted to receive a line card connector; and means for positioning a guide member adjacent the portion of the first set of conductive pins, the guide member operable to guide the line card connector onto the portion of the first set of conductive pins.

30. The system of claim 29, wherein means for positioning a guide member adjacent the portion of the first set of conductive pins comprises means for coupling a set of guide pins adjacent the portion of the first set of conductive pins.

31. The system of claim 29, further comprising means for providing one connector for every twenty-four ports on a line card.

32. The system of claim 29, further comprising means for disposing a ferrite plate between the connector and the backplane.

33. The system of claim 29, further comprising means for coupling a molding to the first set of conductive pins.

34. The system of claim 29, further comprising means for providing the portion of the first set of conductive pins with a pitch that is adapted to a pitch of the contact cavities.

35. The system of claim 34, further comprising means for aligning the portion of the first set of conductive pins in two rows, each row having a two millimeter pitch.

36. The system of claim 34, further comprising means for aligning the portion of the first set of conductive pins in two rows, each row having a 2.54 millimeter pitch.

37. The system of claim 29, wherein means for positioning a ode member adjacent the portion of the first set of conductive pins comprises means for frictionally engaging a plurality of apertures formed in a housing with the portion of the first set of conductive pins.

38. The system of claim 37, further comprising means for providing the housing with a second set of conductive pins, the second set of conductive pins adapted to receive a protect bus.

39. A system for coupling a communication signal to a communication device, comprising:

a backplane having first and second sides;

a connector, adapted to receive the communication signal, coupled to the backplane on the first side, the connector having a first set of conductive pins that extend through the first side and protrude out the second side, a portion of the first set of conductive pins adapted to receive a line card connector being formed with a plurality of contact cavities, the portion of the first set of conductive pins aligned in two rows, each row having a pitch selected from the group consisting of a two millimeter pitch and a 2.54 millimeter pitch;

a ferrite plate disposed between the connector and the backplane;

a housing coupled to the second side of the backplane adjacent to the portion of the first set of conductive pins, the housing formed with a plurality of apertures that are frictionally engaged with the portion of the first set of conductive pins; and wherein the housing further comprises a second set of conductive pins, the second set of conductive pins adapted to recieve a protect bus.

* * * * *

UNITED STATES PATENT AND TRADEMARK OFFICE
CERTIFICATE OF CORRECTION

PATENT NO. : 6,561,836 B1
DATED : May 13, 2003
INVENTOR(S) : Robert A. Marshall et al.

It is certified that error appears in the above-identified patent and that said Letters Patent is hereby corrected as shown below:

Column 7,
Line 37, delete "to transmit the body;" and insert -- to transmit the communication signal to a first portion of a first set of conductive pins coupled to the body; --.

Column 9,
Line 8, delete "ode" and insert -- guide --.

Signed and Sealed this

Eleventh Day of November, 2003

JAMES E. ROGAN
*Director of the United States Patent and Trademark Office*